United States Patent [19]

Haluska et al.

[11] Patent Number: 5,238,787
[45] Date of Patent: Aug. 24, 1993

[54] PHOTODELINEABLE COATINGS FROM HYDROGEN SILSESQUIOXANE RESIN

[75] Inventors: Loren A. Haluska; Keith W. Michael, both of Midland, Mich.

[73] Assignee: Dow Corning Corporation, Midland, Mich.

[21] Appl. No.: 688,418

[22] Filed: Apr. 22, 1991

[51] Int. Cl.⁵ .......................................... G03F 7/075
[52] U.S. Cl. ..................... 430/325; 430/270; 430/330; 430/311
[58] Field of Search ............... 430/325, 330, 332, 331, 430/270, 311, 272, 322

[56] References Cited

U.S. PATENT DOCUMENTS

| | | | |
|---|---|---|---|
| 3,615,272 | 10/1971 | Collins et al. | 23/366 |
| 4,693,960 | 9/1987 | Babich et al. | 430/323 |
| 4,756,977 | 7/1988 | Haluska et al. | 428/704 |
| 4,826,943 | 5/1989 | Ito et al. | 528/21 |
| 4,939,065 | 7/1990 | Cavezzan et al. | 430/167 |
| 4,999,397 | 3/1991 | Weiss et al. | 524/755 |
| 5,021,398 | 6/1991 | Sharma et al. | 505/1 |
| 5,063,297 | 11/1991 | Hanneman et al. | 524/284 |
| 5,098,816 | 3/1992 | Babich et al. | 430/325 |
| 5,110,711 | 5/1992 | Babich et al. | 430/296 |

FOREIGN PATENT DOCUMENTS 0323103 5/1989 European Pat. Off. .
2101150 1/1983 United Kingdom .

Primary Examiner—Marion E. McCamish
Assistant Examiner—Rosemary Ashton
Attorney, Agent, or Firm—Roger E. Gobrogge

[57] ABSTRACT

The present invention relates to a method of forming patterned coatings on substrates, especially electronic devices, by negative resist techniques. The method comprises applying a preceramic coating comprising hydrogen silsesquioxane resin and an initiator onto the substrate and then radiating a selected region of the coating for a time sufficient to cure the resin. The uncured coating is then rinsed away leaving the patterned coating.

23 Claims, No Drawings

PHOTODELINEABLE COATINGS FROM HYDROGEN SILSESQUIOXANE RESIN

BACKGROUND OF THE INVENTION

The present invention relates to a method of forming patterned coatings on substrates, especially electronic devices, by negative resist techniques. The method comprises applying a preceramic coating comprising hydrogen silsesquioxane resin and an initiator onto the substrate and then radiating a selected region of the coating for a time sufficient to cure the resin. The uncured coating is then rinsed away leaving the patterned coating.

Numerous photolithographic techniques are known in the electronics art. One such technique using "negative resists" or "negative photoresists" has become increasingly valuable as the size of electronic components has decreased. Basically, this technique involves 1) the deposition of a radiation sensitive coating onto a substrate, 2) selective radiation of the coating to cure it in certain areas, and 3) removing the uncured portion of the coating with a solvent. The resist portion which remains on the substrate is employed as a protective coating to permit further manipulation of the coated substrate such as selective etching, metallization, or any other treatment of the uncoated areas of the substrate. As such, the resist layer should be thermally stable and stable to any reactive etching. Moreover, the resist should be one which allows for good image resolution or discrimination such that extremely fine patterns can be created.

Cavezzan et al. in U.S. Pat. No. 4,939,065 describe materials which can be used as negative photoresists. They comprise organopolysiloxane polymers which can crosslink by hydrosilylation, a crosslinking catalyst, and a crosslinking inhibitor which is effective at ambient temperature but ineffective on exposure to UV radiation. The organopolysiloxanes described therein comprise an organopolysiloxane with a hydrocarbon group containing alkenyl unsaturation bonded to the silicon atom and an organohydropolysiloxane containing SiH bonds.

Similarly, Ito et al. in U.S. Pat. No. 4,826,943 describe negative resist materials consisting of polysilsesquioxanes of weight average molecular weight 2000 or more represented by the formula $(CH_2=CHCH_2SiO_{3/2})_m(ClCH_2SiO_{3/2})_n$, where m and n are molar percentages and total 100. These polymers are taught therein as being sensitive to radiation and resistant to oxygen plasma reactive ion etching.

Likewise, Babich et al. in U.S. Pat. No. 4,693,960 teach negative resist materials containing a polysiloxane with polymerizable ethylenically unsaturated groups and an acetophenone as a UV light sensitizer. These materials are taught therein to providing good resolution and resistance to oxygen plasma reactive ion etching.

The present inventors have now discovered that compositions comprising hydrogen silsesquioxane resin and an initiator are excellent negative resist materials.

SUMMARY OF THE INVENTION

The present invention relates to a method of making a patterned coating on a substrate. The method comprises applying a preceramic coating comprising hydrogen silsesquioxane resin and an initiator onto the substrate. The coating is selectively radiated for a time sufficient to cure the radiated region of the coating and the pattern is then developed by rinsing off the uncured coating with a solvent.

The invention also relates to substrates containing a patterned coating produced by the above process as well as the negative resist materials used therein.

DETAILED DESCRIPTION OF THE INVENTION

The present invention is based on the discovery that hydrogen silsesquioxane resin can be used to create patterned coatings on substrates. These coatings provide excellent resolution, thermal stability and etch resistance.

The expression "negative resist" as used in this application is used to describe materials which become insoluble in a solvent after exposure to radiation and thereby produce a relief image and the expressions "cure" and "crosslinking" are used interchangeably herein to describe the crosslinking of polymers which renders them insoluble.

The method of the present invention essentially comprises:

applying a coating comprising hydrogen silsesquioxane resin and an initiator onto the substrate;

radiating a selected region of the coating for a time sufficient to cure; and removing the uncured coating by rinsing with a solvent effective for dissolving uncured hydrogen silsesquioxane resin.

Though the coating of the present invention can be applied by any desirable method, a preferred embodiment of this invention comprises applying the coating by a solution technique which comprises dissolving the hydrogen silsesquioxane resin and the initiator in a solvent, coating the substrate with this solution, and then evaporating the solvent.

The term hydrogen silsesquioxane resin or H-resin is used in this application to describe various hydridosilane resins of the formula $HSi(OH)_x(OR)_yO_{z/2}$, in which each R is independently an organic group which, when bonded to silicon through the oxygen atom, forms a hydrolyzable substituent, $x=0-2$, $y=0-2$, $z=1-3$, $x+y+z=3$. Though not represented by this structure, these resins may contain less than the stoichiometric number of Si—H bonds due to various factors involved in their formation or handling. Such resins are generally produced by the hydrolysis and condensation of silanes of the formula $HSiX_3$, wherein X is a hydrolyzable group, and they may be either fully hydrolyzed and condensed $(HSiO_{3/2})_n$ or their hydrolysis or condensation may be interrupted at an intermediate point such that partial hydrolyzates (contain Si—OR groups) and-/or partial condensates (contain SiOH groups) are formed.

Various methods for the production of these resins have been developed. For instance, Collins et al. in U.S. Pat. No. 3,615,272, which is incorporated herein by reference, describe a process of forming nearly fully condensed H-resin (which may contain up to 100-300 ppm silanol) comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159 which is hereby incorporated by reference, teach methods of forming such resins comprising hydrolyzing hydridosilanes in an arylsulfonic acid hydrate hydrolysis medium to form a resin which is then contacted with a neutralizing agent. A preferred embodiment of this latter process uses an acid to silane ratio of about 6/1.

Other resins, such as those described by Frye et al. in U.S. Pat. No. 4,999,397, which is hereby incorporated by reference, and those produced by hydrolyzing an alkoxy or acyloxy silane in an acidic, alcoholic hydrolysis medium are also functional herein.

The method of this invention also requires that an initiator be present in the coating to induce crosslinking of the H-resin and thereby cure the coating to an insoluble state. Various initiators are known in the art and many are commercially available. Such agents can include, for example, free radical precursors which generate the active free radicals upon exposure to radiation. Any of these agents which are capable of causing SiH bond cleavage in the H-resin upon exposure to desired radiation are functional herein. Examples of such agents include peroxides such as dibenzoyl peroxide, bis-p-chlorobenzol peroxide, bis-2,4-dichlorobenzol peroxide, di-t-butyl peroxide, dicumyl peroxide, t-butyl perbenzoate, 2,5-bis(t-butylperoxy)-2,3-dimethylhexane and t-butyl peracetate; benzophenones; acetophenones; azodi (1,1-hexahydrobenzonitrile) (sold under the trade name VAZO 88); azobisisobutyronitrile (sold under the trade name VAZO 64); alpha,alpha-bis tertiary peroxydiisopropylbenzene (sold under the trade name VAL CUP R) and the like.

In addition to the above initiators, other materials containing Si—Si bonds which are activated by radiation to form volatile SiH compounds are also functional herein. Specifically, the material should be one which will be activated by radiation to react with H-resin, strip off the hydrogens from the silicon and volatilize out of the system. These materials are known in the art and can include, for example, dodecamethyl cyclohexasilane, methyltris(trimethylsilyl)silane, decamethyl cyclopentasilane, and tris(trimethylsilyl)phenylsilane. In a preferred embodiment of the invention, the material comprises dodecamethyl cyclohexasilane $((CH_3)_2Si)_6$. This agent can be made by any conventional technique such as the reaction of dimethyldichlorosilane with lithium as described by West et al., Synthesis, Communications, pp. 684-6 (1985), which is incorporated herein by reference.

The amount of a initiator to be used in the present invention should be one which, upon exposure to radiation, induces sufficient crosslinking in the H-resin to prevent removal during development, i.e., sufficient to inhibit solvent removal. This amount varies over a wide range depending on the initiator and the degree of cure desired. Generally, amounts in the range of 0.01 moles initiator per each $(HSiO_{3/2})$ unit to 1 mole initiator per each $(HSiO_{3/2})$ unit are functional with a range of 0.1 moles initiator per each $(HSiO_{3/2})$ unit to 1 mole initiator per each $(HSiO_{3/2})$ unit being preferred.

As set forth above, the H-resin and initiator are then deposited on the surface of the substrate. This can be accomplished in any manner, but a preferred method involves dissolving the ingredients in a solvent to form a solution which is applied to the surface of the substrate. Various facilitating measures such as stirring and/or heating may be used to aid in dissolution. Solvents which may be used include any agent or mixture of agents which will dissolve the ingredients to form a homogenous solution without affecting the ceramic coating. These solvents can include, for example, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1-50 weight percent solution.

If a solution method is used, the solution is coated onto the substrate by a method such as spin coating, dip coating, spray coating or flow coating and the solvent is then allowed to evaporate. Any suitable means of evaporation such as simple air drying by exposure to an ambient environment or by the application of a vacuum or mild heat are functional herein.

Once the coating is applied, selected regions are irradiated. In this manner, only those irradiated areas of the coating are cured and the remainder remains uncured. When the coating is later developed by washing with a solvent, the uncured coating is removed and the remaining cured coating forms the desired pattern.

The selective radiation processes which can be used herein are well known in the art. For example, a masking technique may be used to prevent radiation from reaching certain areas of the coating. Similarly, finely focused radiation, such as that from a laser may be utilized to irradiate specific areas of the coating. Generally, the irradiation herein can be conducted in any atmosphere, but it is particularly preferred to use an inert atmosphere such as nitrogen, helium, argon, etc.

The radiation sources which may be used herein are likewise well known in the art. Sources such as UV light, lasers, electron beams, and X-rays which are capable of activating the initiator are all functional herein. In preferred embodiments of the invention, the radiation source is UV light.

The selectively radiated coating is then developed by rinsing it with a solvent capable of solubilizing the uncured coating without affecting that portion of the coating which has been cured. The method of rinsing is not critical and can be by simple techniques such as placing the coated substrate under a stream or spray of the solvent or by soaking the coated substrate in the solvent. Typical solvents include those which may have been used to dissolve the materials for deposition. For instance, aromatic hydrocarbons, alkanes, ketones, esters, etc. are all functional herein.

If desired the patterned preceramic coating may be ceramified by subjecting it to a sufficient temperature for a sufficient time. Generally, the pyrolysis is conducted at temperatures in the range of about 100° C. to about 1000° C., depending on the pyrolysis environment, for time periods in the range of a few minutes for very thin films to several hours for very thick films.

Any method of heating, such as the use of a convection oven, rapid thermal processing, or radiant or microwave energy, and any pyrolysis atmosphere, such as air, oxygen plasma, ammonia, or inert environments, or pyrolysis condition, such as further UV radiation, are generally functional herein. Similarly, the rate of heating is generally not a critical factor, but it is most practical and preferred to heat the substrate as rapidly as possible.

The thus patterned substrate is then ready for subsequent manipulation such as etching or metallization. In addition, the patterns herein can be used as the top imaging layer in a double layer resist system.

The following non-limiting example is included so that one skilled in the art may more readily understand the invention.

Infrared analyses were run on the silicon wafers (IR transparent) coated in the following example. The conversion to ceramic material is indicated by the removal of the SiH group as evidenced by the disappearance of the IR peak at about 2245 cm$_{-1}$. The percent SiH remaining after hydrolysis was calculated by comparing the area of the SiH peak before and after hydrolysis. Refractive index was measured at the wavelength specified in the table. Thickness was determined by the Rudolph Elipsometer.

EXAMPLE

Hydrogen silsesquioxane resin made by the method of Bank et al. and an initiator (in the amounts specified in Table 1) were dissolved in toluene by stirring in a flask at room temperature to form a clear, non-gelled solution.

1 inch square silicon wafers were coated with these solutions and then spun at 3000 rpm for 35 seconds. A ⅛ inch square alumina mask was then placed in the center of the wafer and the masked wafers were put in a nitrogen atmosphere and exposed to UV light from a 450 watt Canrad-Hanovia medium pressure photochemical lamp for 15 minutes. The wafers were washed with toluene and heated in a UV reactor under the conditions listed in the table. FTIR spectra were taken before and after pyrolysis and the results were compared to determine the amount of SiH reacted.

Examples 1-3 show photodelineation with various initiators. Comparative example 4 shows that no photodelineation occurs without the initiator.

TABLE 1

| Ex. | Preceramic Mixture | Results after 15 minute UV Exposure | Results after 3 hours at 200° C. in Nitrogen with UV Exposure |
|---|---|---|---|
| 1 | 0.5 g H-resin<br>0.82 g DC<br>3.68 g toluene | The masked areas was easily washed off with toluene while the unmasked area did not. | FTIR of the unmasked area showed that some SiH had reacted. |
| 2 | 0.5 g H-resin<br>0.1 g Benzophenone<br>3.68 g toluene | The masked area was easily washed off with toluene while the unmasked area did not. | FTIR of the unmasked area showed that some SiH had reacted. |
| 3 | 0.5 g H-resin<br>0.82 g Vazo 88<br>4.5 g toluene | The masked area was easily washed off with toluene while the unmasked area did not. | FTIR of the unmasked area showed that some SiH had reacted and some si—O—Si shift. |
| 4 | 10 wt % H-resin in Toluene | Coating completely removed by washing with toluene. | |

DC = dodecamethyl cyclohexasilane

That which is claimed is:

1. A method of making a patterned coating on a substrate comprising:
    applying a coating comprising hydrogen silsesquioxane resin and an initiator which generates free radicals upon exposure to radiation onto the substrate;
    radiating a selected region of the coating for a time sufficient to cure the radiated region of the coating; and
    removing the uncured coating by rinsing with a solvent effective for dissolving uncured hydrogen silsesquioxane resin.
2. The method of claim 1 wherein the coating comprising hydrogen silsesquioxane resin and an initiator is applied by a process which comprises coating the substrate with a solution comprising a solvent, hydrogen silsesquioxane resin and the initiator and then evaporating the solvent.
3. The method of claim 2 wherein the patterned coating on the substrate is pyrolyzed to a temperature sufficient to ceramify the patterned coating.
4. The method of claim 3 wherein the patterned coating is ceramified by heating to a temperature in the range of about 100° C. up to about 1000° C.
5. The method of claim 4 wherein the patterned coating is heated in an inert environment.
6. The method of claim 2 wherein said solution contains between about 0.1 and about 50 weight percent solids of hydrogen silsesquioxane and initiator and the solvent is selected from the group consisting of aromatic hydrocarbons, alkanes, ketones, esters, cyclic dimethylpolysiloxanes and glycol ethers.
7. The method of claim 6 wherein the substrate is an electronic device.
8. The device formed by the process of claim 7.
9. The method of claim 1 wherein the initiator is a material containing Si—Si bonds which are activated by radiation to form volatile SiH compounds.
10. The method of claim 9 wherein the initiator is selected from the group consisting of peroxides, benzophenones, acetophenones, azodi (1,1-hexahydrobenzonitrile), azobisisobutyronitrile, and alpha, alpha-bis tertiary peroxydiisopropylbenzene.
11. The method of claim 9 wherein the substrate is an electronic device.
12. The device formed by the process of claim 11.
13. The method of claim 7 wherein the initiator is dodecamethyl cyclohexasilane.
14. The method of claim 1 wherein the radiation is selected from the group consisting of UV light, lasers, electron beams, and X-rays.
15. The method of claim 14 wherein the radiation is UV light.
16. The method of claim 14 wherein the substrate is an electronic device.
17. The device formed by the process of claim 16.
18. The method of claim 1 wherein the radiated coating is rinsed with a solvent selected from the group consisting of aromatic hydrocarbons, alkanes, ketones, esters, cyclic dimethylpolysiloxanes, and glycol ethers.
19. The method of claim 18 wherein the solvent is toluene.
20. The method of claim 18 wherein the substrate is an electronic device.
21. The device formed by the process of claim 20.
22. The method of claim 1 wherein the substrate is an electronic device.
23. The device formed by the process of claim 22.

* * * * *